United States Patent
Wong

(10) Patent No.: US 6,300,688 B1
(45) Date of Patent: Oct. 9, 2001

(54) BOND PAD HAVING VIAS USABLE WITH ANTIFUSE PROCESS TECHNOLOGY

(75) Inventor: Richard J. Wong, Milpitas, CA (US)

(73) Assignee: QuickLogic Corporation, Sunnyvale, CA (US)

(*) Notice: Subject to any disclaimer, the term of this patent is extended or adjusted under 35 U.S.C. 154(b) by 0 days.

(21) Appl. No.: 08/350,865

(22) Filed: Dec. 7, 1994

(51) Int. Cl.[7] .................................................. H01L 29/40
(52) U.S. Cl. .......................... 257/786; 257/734; 257/736; 257/738; 257/750; 257/763; 257/764; 257/765; 257/770; 257/774; 257/781
(58) Field of Search ................................ 257/734, 736, 257/738, 750, 763, 765, 764, 781, 770, 774, 786

(56) References Cited

U.S. PATENT DOCUMENTS

| | | |
|---|---|---|
| 5,289,036 * | 2/1994 | Nishimoto ........................ 257/774 |
| 5,308,795 | 5/1994 | Hawley et al. . |
| 5,412,250 * | 5/1995 | Bruggs ............................ 257/750 |
| 5,502,337 | 3/1996 | Nozaki ............................ 257/773 |

* cited by examiner

Primary Examiner—Eddie Lee
Assistant Examiner—Matthew E. Warren
(74) Attorney, Agent, or Firm—Skjerven Morrill MacPherson LLP; Alan H. MacPherson; Michael J. Halbert

(57) ABSTRACT

A lower metal plate having a strip-like opening is used in a bond pad structure having metalplugs coupling the lower metal plate to an upper metal plate. A volume of relatively rigid material filling a volume above the strip-like opening transfers stress from the upper metal plate, through the strip-like opening, and to a foundation layer upon which the lower metal plate is disposed. The bond pad structure can be fabricated using the same semiconductor processing steps used to fabricate amorphous silicon antifuse structures having metal plugs.

16 Claims, 4 Drawing Sheets

BOND PAD HAVING VIAS USABLE WITH ANTIFUSE PROCESS TECHNOLOGY

FIELD OF THE INVENTION

This invention relates to bond pads.

BACKGROUND INFORMATION

FIG. 1 (Prior Art) is a cross-sectional diagram of a bond pad structure. A layer of metal is deposited on a layer of oxide 2 and the metal is formed into a first metal plate 1. Metal plate 1 has a square shape when viewed from a top-down perspective. As illustrated, a semiconductor substrate 3 underlies oxide layer 2. After formation of first metal plate 1, a second layer of oxide 4 is deposited over the entire die. An opening is then formed in oxide layer 4 down to first metal plate 1 and a second layer of metal is deposited over the entire die. The second layer of metal is then formed into a second metal plate 5 which also has a square shape when viewed from a top-down perspective. The entire die is then covered with passivation 6. An opening is then formed through passivation 6 in the pad area to expose an upper surface of second metal plate 5. The second layer of oxide 4 of the bond pad structure is the layer of oxide which typically separates a first layer of metal routing leads from an overlying second layer of metal routing leads elsewhere on the die. First metal plate 1 may be connected to other circuitry elsewhere on the die via signal routing leads (not shown) formed of the same first layer of metal that the first metal plate 1 is formed. Similarly, second metal plate 5 may be connected to other circuitry via other signal routing leads (not shown) formed of the same second layer of metal that the second metal plate 5 is formed.

During packaging, one end 8 of a bond wire 7 is attached to the second metal plate 5 and the other end of the bond wire is attached to a lead frame (not shown). End 8 is called a bond ball. The die, bond wires, and lead frame are then encapsulated in plastic to form the integrated circuit package. As the plastic of the package cools it solidifies it shrinks. Because the bond wires (and the bond balls) are encapsulated in the shrinking plastic, the shrinkage of the plastic with respect to the die is manifest as a force on the bond balls inward toward the center of the die. A stress, indicated in FIG. 1 by arrows A, is therefore induced in the bond pad structure. Plates 1 and 5 which are made of relatively soft metal satisfactorily transfer the stress from the bond ball 8 to the relatively rigid oxide layer 2 which in turn transfers the stress to the underlying rigid semiconductor substrate 3.

FIG. 2 (Prior Art) is a cross-sectional diagram of a metal-to-metal amorphous silicon antifuse structure 9 and another bond pad structure. An amorphous silicon feature 10 of antifuse 9, when unprogrammed, has a high resistance which leaves a first signal routing lead 11 formed of the first metal layer essentially electrically isolated from a second signal routing lead 12 formed of the second metal layer. Antifuse 9 can, however, be programmed to form a permanent low resistance electrical connection between the first signal routing lead 11 and the second signal routing lead 12. Programming is accomplished by flowing a suitable programming current through the amorphous silicon feature 10 such that a conductive filament is formed through the amorphous silicon feature 10 thereby connecting the second routing lead 12 to a conductive tungsten plug 13 of the antifuse structure. An electrical connection is therefore formed from the first signal routing lead 11, through the tungsten plug 13, through the filament in the amorphous silicon feature 10, and to the second routing lead 12.

To make the amorphous silicon antifuse structure 9, oxide 4 is deposited and then a via is formed through the oxide 4 down to the first signal routing lead 11. Tungsten is then blanket chemical vapor deposited (CVD) over the entire surface of the die so that tungsten fills the via and makes contact with the first signal routing lead 11. The CVD tungsten deposits on all surfaces so that the via fills from the bottom and sides. As the tungsten is deposited in the minimum sized via, the tungsten deposited on the sidewalls of the via meets and completely fills the via. Thus, as the tungsten deposition process continues, the tungsten deposits on top of the filled via resulting in a somewhat planar surface. The tungsten is then reactive ion etched (RIE) back to the upper surface of oxide 4. The RIE etchback removes a layer of tungsten from the non-via area and from the via area. However, because the vertical thickness of the tungsten in the via area is much thicker due to the sidewall deposition, a plug of tungsten is left in the via. After tungsten etching, a chemical/mechanical polishing process is used to planarize an upper surface of oxide 4 and tungsten plug 13. A layer of amorphous silicon is then deposited onto this planar surface and etched to form an oversized version of silicon feature 10. A second metal layer is then deposited and formed into second signal routing lead 12. The oversized amorphous silicon feature is then etched to form the stack of the second metal routing 12 and the amorphous silicon feature 10.

Due to the tungsten deposition and etch process, it is generally not desirable to have a large via in oxide 4. The tungsten deposited on the via sidewalls cannot meet in the center of a large via. A thin portion of tungsten will therefore be left in the center of the via. During tungsten etchback, the thin center portion of tungsten will be removed leaving only a tungsten stringer around the periphery of the large via. During chemical/mechanical polish, the tungsten stringer which is bounded by oxide only on one side has a tendency to lift off. Pieces of tungsten stringer may be dispersed over the surface of the die and become a defect problem.

Accordingly, a plurality of minimum feature size vias are formed in oxide layer 4 so that the resulting tungsten plugs (one of which is designated with reference numeral 14 in FIG. 2) in the vias will provide a good electrical connection between the first metal plate 1 and the second metal plate 5 but will not have portions which tend to lift off. The remaining oxide forms a mesh-like oxide structure 15 between the first and second metal plates 1 and 5. Accordingly, a bond pad is formed on the same die with an amorphous silicon antifuse structure 9 having a minimum feature size tungsten plug 13.

A problem, however, exists with the structure of FIG. 2. When the structure is encapsulated in plastic, a stress A develops between bond ball 8 and oxide layer 2. Although metal plates 1 and 5 can deform to relieve the stress, oxide mesh 15 is relatively rigid and does not deform. Consequently, stress may develop in rigid mesh 15 thereby causing cracks 16 to form in rigid mesh 15. The packaged integrated circuit may therefore have to be discarded due to a physically impaired bond pad structure.

SUMMARY

In one embodiment, a lower conductive plate having a strip-like opening is used in a bond pad structure having conductive plugs coupling the lower conductive plate to an upper conductive plate. A volume of relatively rigid material filling a volume above the strip-like opening transfers stress from the upper conductive plate, through the strip-like opening, and to a foundation layer upon which the lower conductive plate is disposed. The bond pad structure can be fabricated using the same process steps used to fabricate amorphous silicon antifuse structures having conductive plugs.

DETAILED DESCRIPTION OF THE PREFERRED EMBODIMENTS

Figure 1:
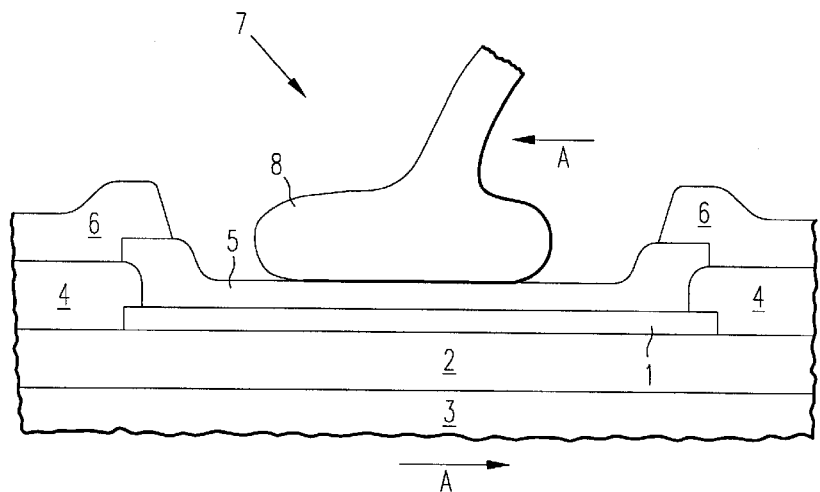
FIG. 1 (Prior Art) is a cross-sectional diagram of a bond pad structure.
Figure 2:
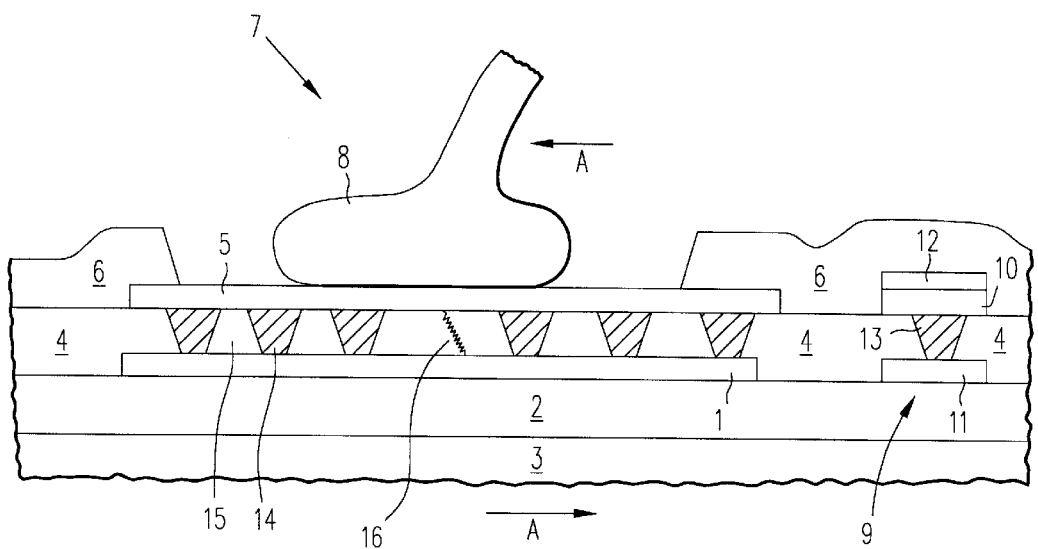
FIG. 2 (Prior Art) is a cross-sectional diagram of an amorphous silicon antifuse structure and another bond pad structure.
Figure 3:
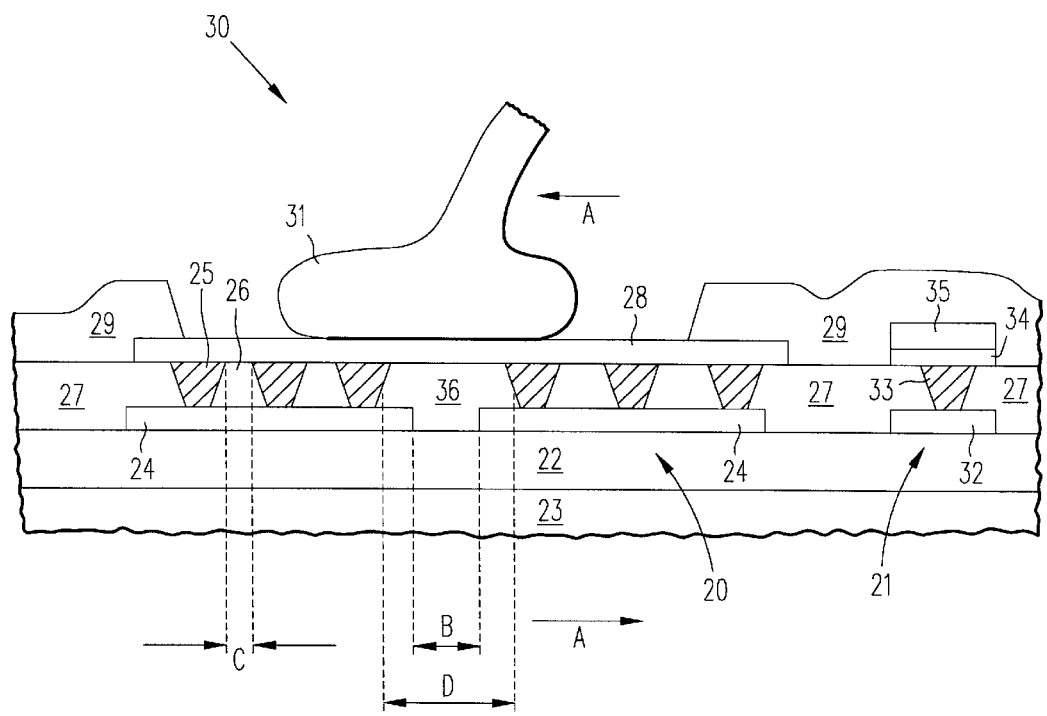
FIGS. 3 and 3A are cross-sectional diagrams of a bond pad structure and an amorphous silicon antifuse structure in accordance with an embodiment of the present invention.

FIG. 3 is a cross-sectional diagram of a bond pad structure 20 and an amorphous silicon antifuse structure 21 in accordance with an embodiment of the present invention. A layer of oxide 22 is disposed on a semiconductor substrate 23. Oxide layer 22 and substrate 23 form a foundation for the bond pad structure. Although layers 22 and 23 are disclosed here, it is to be understood that other suitable foundations for the bond pad may be used. The bond pad structure 20 includes a first metal plate 24 formed of first metalization, a plurality of tungsten plugs 25, a mesh portion 26 of an oxide layer 27 having vias into which the plugs are disposed, and a second metal plate 28 formed of second metalization. An opening is formed in a passivation layer 29 such that a bond wire 30 having a bond ball 31 can be connected to the upper surface of the second metal plate 28.

Antifuse structure 21 includes a first signal routing lead 32 formed of first metalization, a tungsten plug 33 disposed in a via in oxide layer 27, an amorphous silicon feature 34, and a second signal routing lead 35 formed of second metalization. Accordingly, the same tungsten deposition, etchback, and chemical/mechanical polishing process is used to form the bond pad structure and the antifuse structure. Vias are formed in oxide layer 27 by reactive ion etching (RIE), tungsten is blanket CVD deposited over the entire die so that the vias are filled with tungsten, excess tungsten is removed by etching, and the surface formed by oxide layer 27 and the tungsten plugs in the vias in the bond pad structure and in the antifuse structure is planarized by chemical/mechanical polishing. For additional information on the making of the amorphous silicon antifuse structure, see U.S. patent application Ser. No. 07/892,466, entitled "Programmable Interconnect Structures And Programmable Integrated Circuits", the subject matter of which is incorporated herein by reference. Stress can be transferred through the bond pad structure 20 from the bond ball 31 to the oxide layer 22. To prevent mesh oxide 26 from being subjected to large stresses that may cause mesh oxide 26 to crack, a strip-like opening is formed in the first layer of metal 24 such that an elongated strip-like volume of oxide 36 contacts both the bottom surface of the second metal plate 28 and the upper surface of oxide layer 22. This elongated strip-like volume of oxide is relatively wide so that it will be strong and will not crack under a typical stress between the bond ball 31 and the underlying oxide layer 22. Accordingly, stress between the second metal plate 28 and the underlying oxide layer 22 is transferred through volume 36. Less stress is therefore transferred through the oxide mesh 26 and metal plate 24.

In some embodiments, the width D of the elongated strip-like volume of oxide 36 is greater than distance C of oxide between adjacent plugs so that the elongated strip-like volume of oxide will not crack under a lateral stress as easily as the oxide between adjacent plugs having separation C. In some embodiments, the strip-like opening in the first metal plate 24 is larger than the width C between adjacent plugs.

In one embodiment, B is 2.0 microns, C is 1.2 microns and D is 9.6 microns. The outside dimensions of first metal plate 24 are 110 by 110 microns square, the tungsten plugs are 0.8 by 0.8 microns square and extend 1.0 microns in the vertical dimension. The first and second metal plates are 8,900 angstroms and 9,200 angstroms thick, respectively. In the embodiment of FIG. 3, first and second metal plates each includes a lower titanium-tungsten layer, a middle aluminum-copper layer, and an upper titanium-tungsten layer. The amorphous silicon of the antifuse structure is deposited by plasma enhanced chemical vapor deposition (PECVD). Although the plugs of the embodiment of FIG. 3 are made of tungsten, other materials including titanium-tungsten and aluminum-copper may be used. The shapes and sizes of the vias may also be tailored to the particular process employed and/or the particular application for which the die is to be used.

Figure 3A:
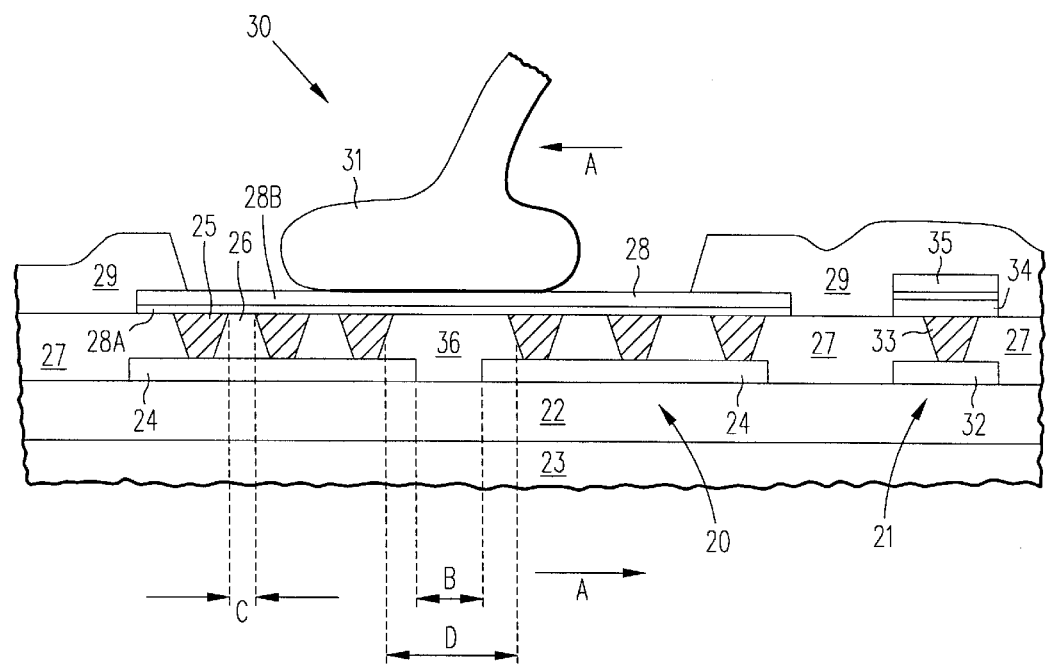

FIG. 3A is a cross-sectional diagram showing second metal plate 28 comprising a layer of titanium-tungsten 28A and a layer of aluminum 28B.

Figure 4:
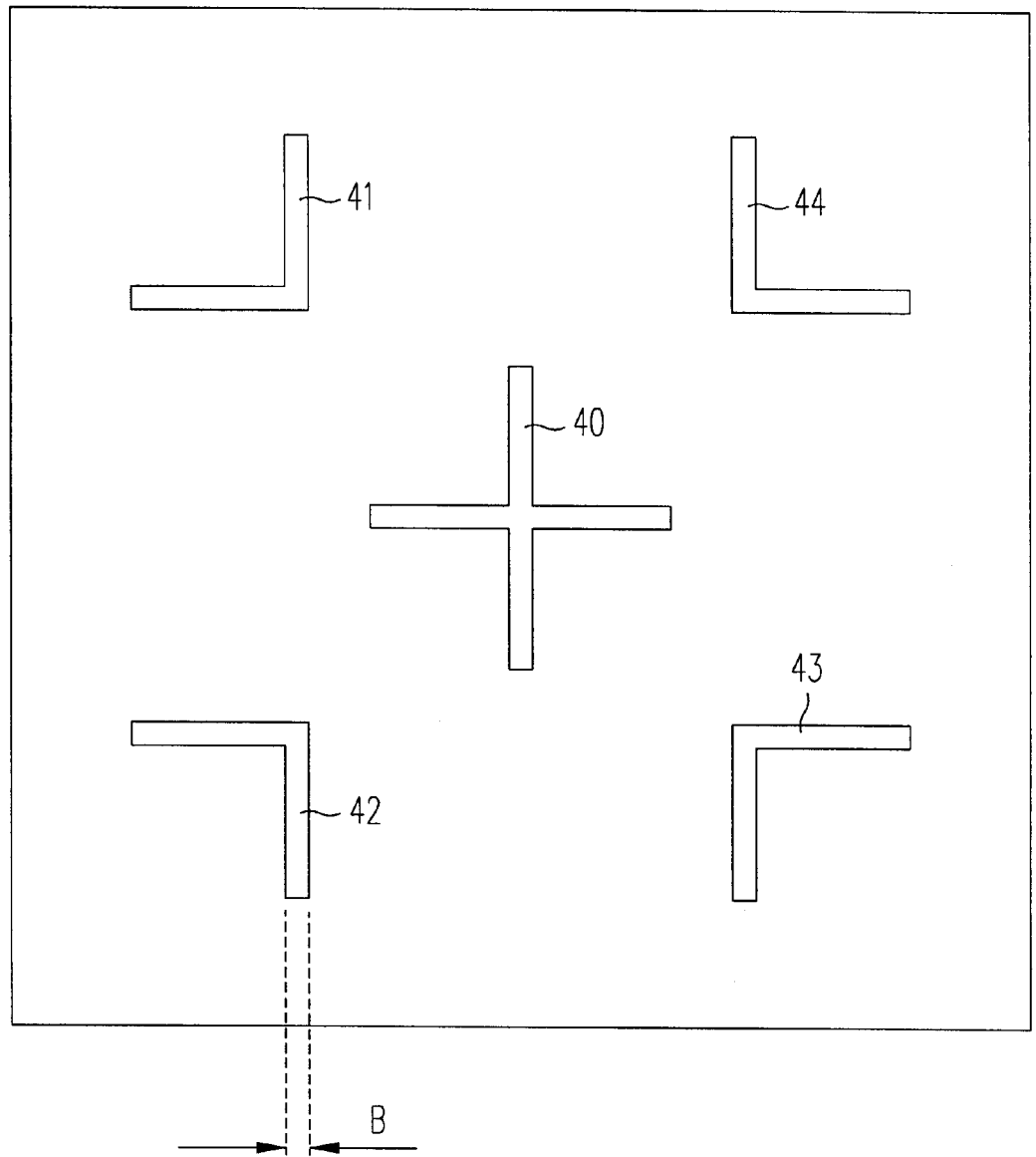
FIG. 4 is a top-down diagram of a first metal plate in accordance with one specific embodiment of the present invention.
Figure 5:
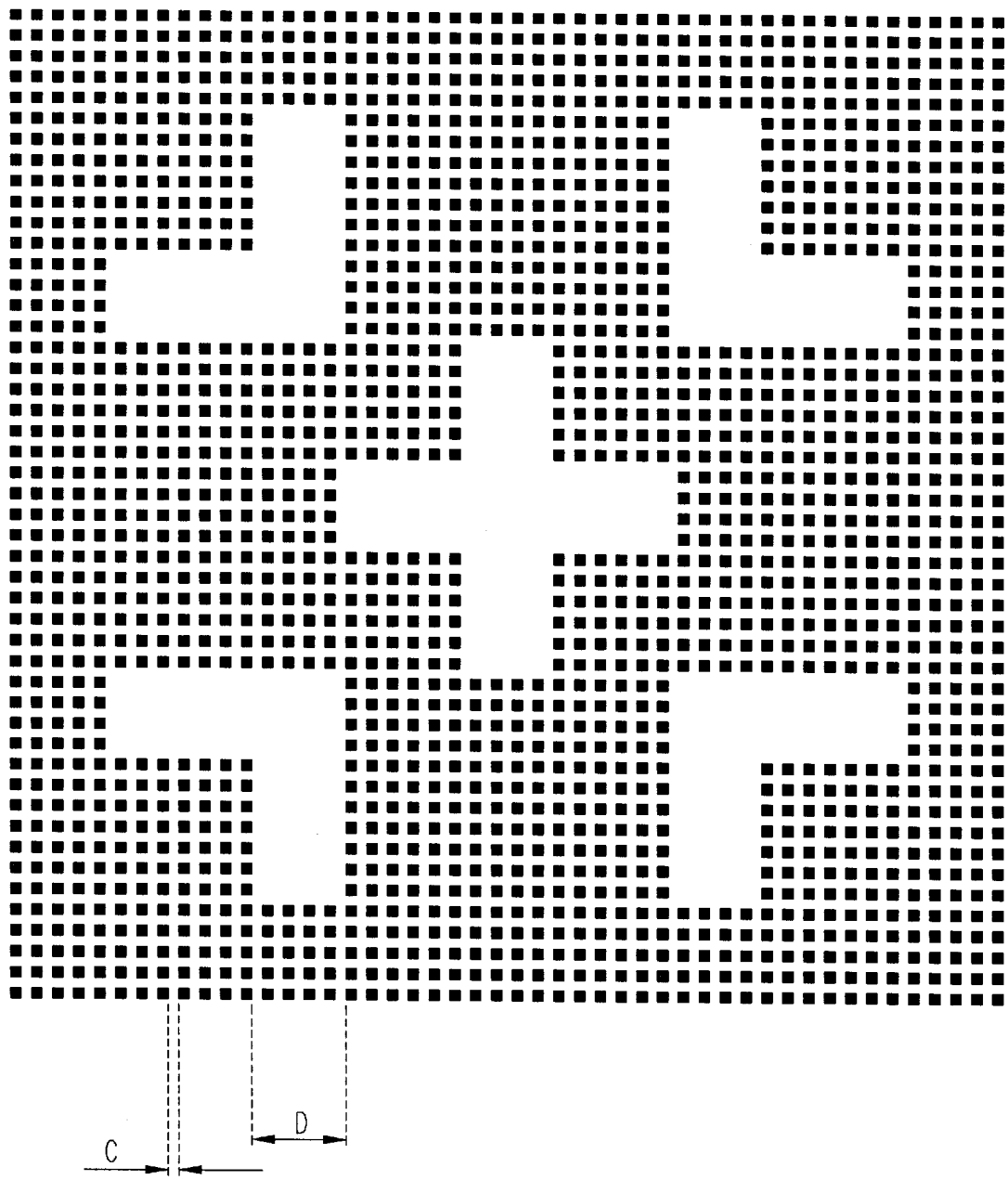
FIG. 5 is a top-down diagram of the metal plugs of the embodiment of FIG. 4.

FIG. 4 is a top-down diagram of the first metal plate in accordance with one specific embodiment of the present invention. FIG. 5 is a top-down diagram of the metal plugs of the specific embodiment of FIG. 4. The first metal plate has five strip-like openings 40–44. The central strip-like opening 40 has a cross-like shape. Each of the outer four strip-like openings 41–44 has an L-like shape. The openings are oriented such that the bond pad structure can transfer stress due to a bond ball force exerted in any lateral direction. This allows the bond pad to be placed on a die during chip layout without regard to the direction of the eventual stress.

Although the present invention is described in connection with certain specific embodiments into order to illustrate the invention for instructional purposes, the present invention is not limited to those specific embodiments. The present invention is not limited to use with plastic packages. Stress on parts of a bond pad susceptible to cracking may be relieved by other than an elongated strip-like volume of oxide in contact with the foundation underlying the bond pad. The present invention is usable with antifuse technologies other than the tungsten plug amorphous silicon technology described herein. Conductive plugs employing both conductive and nonconductive portions can be employed. The conductive plug of U.S. Pat. No. 5,308,795 may be employed. The opening and/or openings in the first plate need not have a strip-like shape but rather can have any suitable shape including squares, other polygons, circles and rings. In some embodiments, there are no openings in the first plate but rather a relatively wide elongated volume of oxide between the first plate and the second plate transfers stress without cracking and prevents the oxide mesh from cracking. Accordingly, various modifications, adaptations and combinations of various features of the various embodi-

What is claimed is:

1. A bond pad structure, comprising:

a first metal plate, an opening existing in said first metal plate;

a second metal plate disposed over said first metal plate and extending over said opening;

a layer of oxide disposed between said first metal plate and said second metal plate, a plurality of vias formed in said layer of oxide between said first metal plate and said second metal plate; and a plurality of conductive plugs, each of said conductive plugs being disposed in a respective one of said vias, each of said conductive plugs being electrically coupled to said first metal plate and said second metal plate.

2. The bond pad structure of claim 1, wherein oxide of said layer of oxide fills a volume extending upward from said opening to a bottom surface of said second metal plate.

3. The bond pad structure of claim 1, wherein said conductive plugs consist essentially of tungsten.

4. The bond pad structure of claim 1, wherein said conductive plugs comprise tungsten.

5. The bond pad structure of claim 1, wherein said second metal plate comprises:

a layer of titanium-tungsten in contact with said plurality of conductive plugs; and a layer of aluminum disposed over said layer of titanium-tungsten.

6. The bond pad structure of claim 1, wherein said opening forms a cross-shaped opening in said first metal plate.

7. The bond pad structure of claim 1, wherein said first metal plate has a plurality of separate strip-like openings, said second metal plate extending over each of said plurality of strip-like openings.

8. The bond pad structure of claim 1, wherein said first metal plate is disposed on and in direct contact with a layer of oxide.

9. The bond pad structure of claim 1, wherein said opening is a strip-like opening having a width B and wherein adjacent conductive plugs are separated by a distance C, B being substantially greater than C.

10. The bond pad structure of claim 1, wherein each of said conductive plugs has a minimum lateral cross-sectional feature size for the process used to fabricate the bond pad.

11. A bond pad structure comprising:

a first metal plate, an opening existing in said first metal plate;

a second metal plate disposed over said first metal plate and extending over said opening;

a layer of oxide disposed between said first metal iplate and said second metal plate, a plurality of vias formed in said layer of oxide between said first metal plate and said second metal plate; and a plurality of conductive plugs, each of said conductive plugs being disposed in a respective one of said vias, each of said conductive plugs being electrically coupled to said first metal plate and said second metal plate, wherein oxide of said layer of oxide fills a volume extending upward from said opening to a bottom surface of said second metal plate, and wherein the oxide that fills said volume has a width D and wherein adjacent conductive plugs are separated by a distance C, D being substantially greater than C.

12. An integrated circuit, comprising:

an antifuse structure comprising a conductive plug, said conductive plug being disposed in a via in an insulative layer; and a bond pad structure comprising a first conductive plate, a second conductive plate disposed over said first conductive plate, and a plurality of conductive plugs each of which is electrically coupled to both said first and second conductive plates, an opening being present in said first conductive plate.

13. The integrated circuit of claim 12, wherein said opening has a square shape.

14. The integrated circuit of claim 12, wherein said opening has a strip-like shape.

15. The integrated circuit of claim 12, further comprising:

a bond ball in direct contact with said bond pad structure.

16. A bond pad structure, comprising:

a conductive plate;

rows and columns of conductive plugs underlying said conductive plate, each of said conductive plugs being electrically coupled to a bottom surface of said conductive plate; and a rigid insulative layer disposed underneath said first conductive plate, each of said conductive plugs being formed in a respective one of a plurality of vias formed in said rigid insulative layer, a portion of said rigid insulative layer having a mesh-like form wherein adjacent ones of said conductive plugs are separated by a spacing A, another portion of said rigid insulative layer having no plugs in a lateral area approximately 4A square.

* * * * *